(12) United States Patent
Myoung et al.

(10) Patent No.: US 11,870,409 B2
(45) Date of Patent: Jan. 9, 2024

(54) COMPACT TRANSFORMER-BASED NOTCH FILTER

(71) Applicant: NEWRACOM, INC., Lake Forest, CA (US)

(72) Inventors: Seong-Sik Myoung, Irvine, CA (US); Jonghoon Park, Irvine, CA (US)

(73) Assignee: NEWRACOM, INC., Irvine, CA (US)

( * ) Notice: Subject to any disclaimer, the term of this patent is extended or adjusted under 35 U.S.C. 154(b) by 0 days.

(21) Appl. No.: 17/567,672

(22) Filed: Jan. 3, 2022

(65) Prior Publication Data

US 2022/0216856 A1 Jul. 7, 2022

Related U.S. Application Data

(60) Provisional application No. 63/134,157, filed on Jan. 5, 2021.

(51) Int. Cl.
*H03H 11/04* (2006.01)
*H01F 27/28* (2006.01)
*H03F 3/45* (2006.01)

(52) U.S. Cl.
CPC ............ *H03H 11/04* (2013.01); *H01F 27/28* (2013.01); *H03F 3/45475* (2013.01); *H03H 2011/0488* (2013.01)

(58) Field of Classification Search
None
See application file for complete search history.

(56) References Cited

U.S. PATENT DOCUMENTS 3,925,739 A * 12/1975 Brownell ............. H03H 7/1758
333/176
2007/0252659 A1* 11/2007 Suenaga ........... H04L 12/40032
333/32

* cited by examiner

*Primary Examiner* — Daniel C Puentes

(57) ABSTRACT

A notch filter is coupled to a first input node and a second input node, and is configured to present a capacitive load to a differential signal provided to the first and second input nodes, and to present a series-resonant inductive-capacitive load to a common-mode signal provided to the first and second input nodes. The notch filter includes a transformer and a capacitor bank. The transformer includes a first winding having a positive-polarity terminal coupled to the first input node and a second winding having a positive-polarity terminal coupled to the second input node. The capacitor bank includes a first capacitor coupled between a negative-polarity terminal of the first winding and a bias node, and a second capacitor coupled between a negative-polarity terminal of the second winding and the bias node. The first and second capacitors may be variable capacitors.

12 Claims, 4 Drawing Sheets

COMPACT TRANSFORMER-BASED NOTCH FILTER

CROSS-REFERENCE TO RELATED APPLICATION

This application claims the benefit of U.S. Provisional Application No. 63/134,157, filed on Jan. 5, 2021, the contents of which are incorporated herein by reference.

BACKGROUND

In RF transmitter design, spurious emissions are one of the most important performance parameters, because many modern wireless communication standards and local regulations define emission limits for spurious emissions to ensure co-existence between various communication devices, standards, and so on. The leakage of the second order harmonic of the carrier frequency to the RF transmitter output port often causes a failure to meet the emission limit.

An external filter may be used to suppress of the second order harmonic. However, using the external filter causes an increase in the BOM (Bill Of Materials) cost and an increase in the size of the physical form factor of the module. Moreover, the output power is decreased due to losses of the external filter, which causes degradation of the overall power efficiency. As a result, the external filter is not an attractive solution, especially for the modern low cost and low power IoT (Internet of Things) applications.

An inductive-capacitive (LC) series resonator on the RF output port as an internal filter in the transceiver IC may also be used to suppress the second order harmonic. This internal filter may be more attractive than an external filter because of its lower BOM cost and smaller physical form factor. However, the fundamental tone (that is, the desired output signal) suffers from more severe signal loss with this internal filter, because an integrated LC series resonator for second order harmonic suppression usually produces much larger loss of signal than an external filter. Due to this large signal loss, the LC series resonator on the RF output port is also not a good solution for second order harmonic suppression.

Accordingly, a need exists for a compact, low-cost, low-loss circuit for leakage suppression of the second order harmonic of the carrier frequency of an RF transmitter.

TECHNICAL FIELD

Embodiments of the present disclosure relate to integrated radio-frequency filters, and in particular to filters for suppression of carrier frequency harmonics that can be integrated into a semiconductor die.

BRIEF SUMMARY

In an embodiment, a circuit comprises a first input node, a second input node, a bias voltage node coupled to a direct-current (DC) voltage value; and a notch filter. The notch filter comprises a filter transformer including a first winding and a second winding, and a capacitor bank including a first capacitor and a second capacitor. A positive-polarity terminal of the first winding is coupled to the first input node and a negative-polarity terminal of the first winding is coupled to a first terminal of the first capacitor. A positive-polarity terminal of the second winding is coupled to the second input node and a negative-polarity terminal of the second winding is coupled to a first terminal of the second capacitor. A second terminal of the first capacitor and a second terminal of the second capacitor are coupled to the bias voltage node.

In embodiments, the first winding and the second winding are disposed within a semiconductor die, and an area occupied by the first winding overlaps an area occupied by the second winding.

In embodiments, the capacitor bank is also disposed within the semiconductor die.

In embodiments, the first capacitor is a variable capacitor having a capacitance controlled by a capacitance control signal, and the second capacitor is a variable capacitor having a capacitance controlled by the capacitance control signal.

In an embodiment, a circuit comprises a first input node, a second input node, and a notch filter coupled to the first input node and the second input node. The notch filter is configured to present a capacitive load to a differential signal provided to the first and second input nodes, and to present a series-resonant inductive-capacitive load to a common-mode signal provided to the first and second input nodes.

DETAILED DESCRIPTION

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description in order to provide a thorough understanding. These details are provided for the purpose of example and embodiments may be practiced according to the claims without some or all of these specific details. For the sake of clarity, technical material that is known in the technical fields related to this disclosure has not been described in detail so that the disclosure is not unnecessarily obscured.

Figure 1:
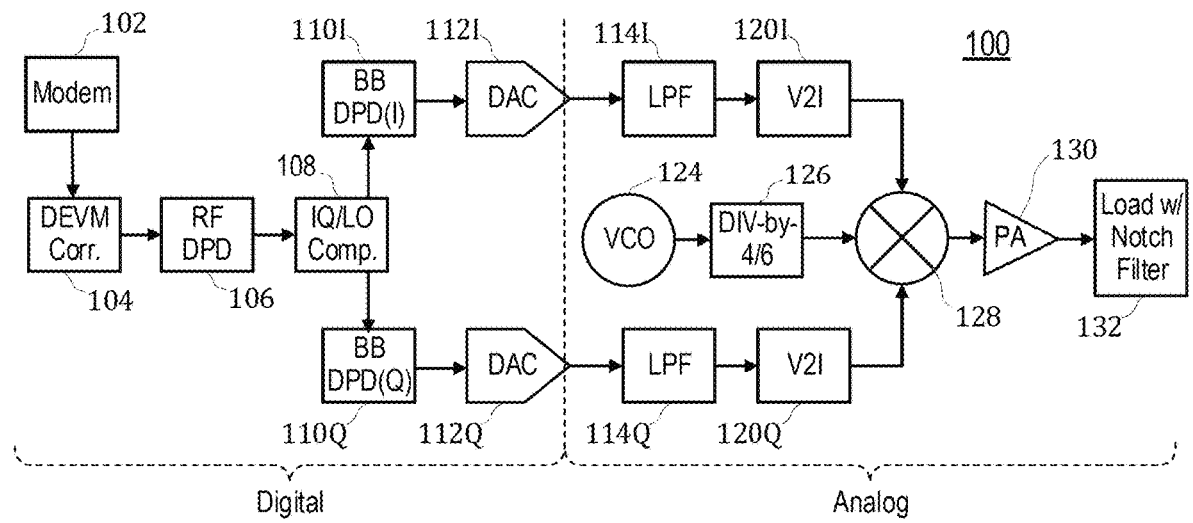
FIG. 1 illustrates a portion of a transmitter chain according to an embodiment.

FIG. 1 illustrates a portion of a transmitter chain 100 according to an embodiment. The transmitter chain includes a digital portion in which signals are primarily processed as digital signals comprising one or more bits having respective discrete values corresponding to 0 or 1, and an analog portion in which signals are primarily processed as analog signals have continuous values represented as a magnitude of a voltage or current within a continuous range.

The digital portion of the transmitter chain 100 includes a modem module 102, a Radio Frequency section (RF) Digital Pre-Distortion (DPD) module 106, a Dynamic Error Vector Magnitude (DEVM) correction module 106, an IQ mismatch/Local Oscillator leakage (IQ/LO) compensation module 108, an I-path baseband (BB) DPD module 110I, a Q-path BB DPD module 110Q, an I-path Digital-to-Analog Converter (DAC) 112I, and a Q-path Digital-to-Analog Converter (DAC) 112Q. In embodiments, the modules in the digital portion of the transmitter chain may be implemented using purpose-built electronic circuitry, field-programable logic, processors executing computer programming instructions stored on non-transitory computer readable media, or combinations thereof, but embodiments are not limited thereto.

The analog portion of the transmitter chain 100 includes an I-path Low-Pass Filter (LPF) 114I, a Q-path LPF 114Q, an I-path voltage-to-current (V2I) converter 120I, a Q-path V2I converter 120Q, a Voltage-Controlled Oscillator (VCO) 124, a divider circuit 126, a mixer 128, a power amplifier (PA) 130, and a load circuit 132 that includes a notch filter. In embodiments, the above-listed components of the analog portion of the transmitter chain 100 are each purpose-built electronic circuitry, but embodiments are not limited thereto.

The modem 102 may produce an output signal comprising a sequence of digital values. The digital values may represent complex numbers and accordingly each digital value may include a real value (I) and a complex value (Q) each expressed as a number represented by a plurality of bits. In embodiments, the modem 102 may be a modem designed to produce signals according to a wireless standard. For example, the modem 102 may be a IEEE Std 802.11ah modem.

The DEVM correction module 104 operates to compensate for the variation in the instantaneous gain of the transmitter chain 100 that may occur due to, for example, the transmitter chain 100 experiencing a change in temperature after the transmitter chain 100 begins transmitting. The DEVM correction module 104 produces an output by applying a time-varying gain to a signal received from the modem.

In embodiments, a Crest Factor Reduction (CFR)/Spectrum Shaping Filter (SSF) module (not shown) may process the output of the modem 102 and provide the processed output to the DEVM correction module 104. The processing of the output of the modem 102 by the CFR/SSF module provides proper spectrum shaping and Error Vector Magnitude (EVM), and reduces the Peak-to-Average Power Ratio (PAPR) of the output.

The RF DPD module 106 pre-distorts the output of the DEVM correction module 104 to compensate for non-linearities in the PA 130, and in particular for variations in the gain of the PA 130 that depend on the magnitude of the signal input to the PA 130. The RF DPD module 106 may be configured to compensate for Amplitude-to-Amplitude modulation (AM2AM) nonlinearity, Amplitude-to-Phase modulation (AM2PM) nonlinearity, or both.

The IQ/LO compensation module 108 modifies the output of the RF DPD module 106 to compensate for any mismatch between the analog portion of the real (I) path and the analog portion of the imaginary (Q) path, for DC offset in the mixer 128, for leakage from the local oscillator, or combinations thereof. The real component of the output of the IQ/LO compensation module 108 is provided to the I-path BB DPD module 110I, and the imaginary component of the output of the IQ/LO compensation module 108 is provided to the Q-path BB DPD module 110Q.

The I-path BB DPD module 110I compensates for non-linearity caused by I-path baseband blocks such as the I-path LPF 114I, the I-path V2I converter 120I, and the mixer 128. The I-path BB DPD module 110I may compensate for only AM2AM distortion because the signals in the I-path are real (i.e., not complex) signals.

Similarly, the Q-path BB DPD module 110Q compensates for nonlinearity caused by Q-path baseband blocks such as the Q-path LPF 114Q, the Q-path V2I converter 120Q, and the mixer 128. The Q-path BB DPD module 110Q may compensate for only AM2AM distortion because the signals in the Q-path are real (i.e., not complex) signals.

The I-path DAC 112I converts the output of the I-path BB DPD module 110I from multi-bit digital values to corresponding analog values. The Q-path DAC 112Q converts the output of the Q-path BB DPD module 110Q from multi-bit digital values to corresponding analog values. In an illustrative embodiment, the DACs 112I and 112Q have a sampling rate fs of 32 MHz.

The I-path LPF 114I filters the output of the I-path DAC 112I. In an illustrative embodiment, the I-path LPF 114I has a selectable cut-off frequency (for example, the cut-off frequency may be configurable to be any one of a 1.5 MHz, 3 MHz, and 6 MHz) but embodiments are not limited thereto.

Similarly, the Q-path LPF 114Q filters the output of the Q-path DAC 112Q. In an illustrative embodiment, the Q-path LPF 114Q has a selectable cut-off frequency (for example, the cut-off frequency may be configurable to be any one of a 1.5 MHz, 3 MHz, and 6 MHz) but embodiments are not limited thereto.

The I-path V2I converter 120I produces an output current corresponding to an input voltage received from the I-path LPF 114I. The Q-path V2I converter 120Q produces an output current corresponding to an input voltage received from the Q-path LPF 114I.

The respective input voltages of the V2I converters 120I and 120Q may be received as differential signals, wherein the input voltage corresponds to a voltage difference between voltages of a pair of signals. In embodiments, the respective output currents of the V2I converters 120I and 120Q may be produced as differential signals, wherein the output current corresponds to a difference between currents of a pair of signals.

The VCO 124 produces an RF signal having a frequency according to a control voltage provided to the VCO 124. In an illustrative embodiment, the VCO 124 produces a signal having a frequency in the range of 2.56 to 3.84 GHz, according to the control voltage.

The divider circuit 126 produces a carrier signal by performing frequency division on the output of the VCO 124. In an illustrative embodiment, the ratio of the frequency division is selectable. For example, in an illustrative embodiment the divider circuit 126 may divide the output of the VCO 124 by either 4 or 6 according to a control signal provided to the divider circuit 126. Accordingly, in an illustrative embodiment wherein the VCO 124 produces a signal having a frequency in the range of 2.56 to 3.84 GHz, the divider circuit 126 may produce a carrier signal having a frequency of 426 MHZ to 640 MHz when the ratio is set to 6 and having a frequency of 640 MHZ to 960 MHz when the ratio is set to 4.

The mixer 128 combines the outputs of V2I converters 120I and 120Q and the output of the divider circuit 126 to produce a modulated RF signal.

The PA 130 amplifies the modulated RF signal and provides it to the load circuit 132. The load circuit 132 may include, for example, a tunable notch filter configured to filter out second harmonics of the modulated RF signal caused by nonlinearities in the PA 130. The load circuit 132 may further include a load transformer to perform impedance matching, provide isolation, convert the differential output signal of the PA 130 to a single-ended signal, or combinations thereof. The load circuit 132 may produce an output that may be provided to an antenna or another RF transmission medium (such as coaxial cable, stripline, twist pair cable, or the like).

The PA 130 typically has the differential topology in order to achieve higher output power, and the differential output of the PA 130 is converted by a balun (BALanced to UNbalanced) transformer in the load circuit 232 into the single-ended output for the transceiver IC output port. Because the power efficiency of the PA 130 of the modern IoT (Internet of Things) applications that use a battery power supply should be as high as possible, the core circuits of the PA 130 may be biased in class-AB mode.

This class-AB biasing generates very large even order currents at the second order harmonic of the carrier frequency within the core of the PA 130. Since this even order current in the core of the PA 130 a common mode signal, ideally, the even order current would be perfectly rejected by the balun for the ideal case and the second order harmonics generated by the PA 130 would not be delivered to the RF output port. However, in the real case, the balun has asymmetry and the common mode rejection is limited by the balun's asymmetry. As a result, the common mode signals leak out to the transceiver output port.

Figure 2:
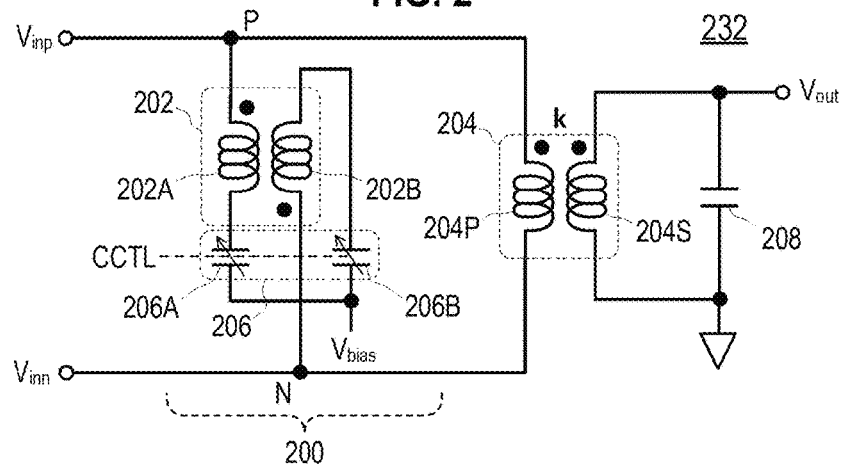
FIG. 2 is a circuit diagram of a load circuit including a notch filter according to an embodiment.

Because the need to maintain high power efficiency prevents the common mode current of the PA 130 being decreased, embodiments provide an additional second order trap circuit (in embodiments, a notch filter) to minimize second order currents flowing to the balun:

FIG. 2 is a circuit diagram of a load circuit 232 including a notch filter according to an embodiment. The load circuit 232 may be included in the load circuit 132 of FIG. 1.

The load circuit 232 includes a notch filter 200, a balun transformer 204, and an output capacitor 208.

The load circuit 232 receives a differential input comprising a positive input signal $V_{inp}$ at an positive input P of the notch filter 200 and at a first terminal of a primary winding 204P of the balun transformer 204, and receives a negative input signal $V_{inn}$ at a negative input N of the notch filter 200 and at a second terminal of the primary winding 204P of the balun transformer 204. Here, "positive" and "negative" refer to complimentary phases of a differential component of the differential input, and not to the sign of the magnitude of the signals themselves. The differential input may also have the common-mode component that is equal in polarity and magnitude on each of the positive input signal $V_{inp}$ and the negative input signal $V_{inn}$.

In an embodiment, the differential input comprising positive input signal $V_{inp}$ and the negative input signal $V_{inn}$ corresponds to an output of a differential power amplifier, the output comprising a positive output signal and a negative output signal. In an embodiment, the power amplifier is a class-AB power amplifier.

The load circuit 232 outputs a single-ended output signal $V_{out}$ from a first terminal of a secondary winding 204S of the balun transformer 204. A second terminal of the secondary winding 204S is coupled to ground, and the output capacitor 208 is coupled between the first and second terminals of the secondary winding 204.

The notch filter 200 includes a filter transformer 202 and a capacitor bank 206. In embodiments, the capacitor bank 206 is a variable capacitor bank having a capacitance controlled by a capacitance control signal CCTL.

The capacitance control signal CCTL may be used to control a notch frequency of the notch filter 200. For example, in an embodiment, the capacitance control signal CCTL may vary the capacitance of the capacitor bank 206 so as to tune the notch frequency of the notch filter 200 across a range spanning 960 MHz to 1240 MHz, corresponding to second harmonics of carrier frequencies within the US Federal Communication Commission (FCC) Television White-Space (TVWS) band, but embodiments are not limited thereto.

In some embodiments, the capacitance control signal CCTL may be a digital signal comprising a plurality of bits. In other embodiments, the capacitance control signal CCTL may be an analog signal.

A positive-polarity terminal (indicated by a dot in FIG. 2) of a first winding 202A of the filter transformer 202 is coupled to the positive input P, and a positive-polarity terminal of a second winding 202B of the filter transformer 202 is coupled to the negative input N. A negative-polarity terminal of the first winding 202A (the end of the winding without a dot in FIG. 2) is coupled to a first terminal of the capacitor bank 206, and a negative-polarity terminal of the second winding 202B of the filter transformer 202 is coupled to a second terminal of the capacitor bank 206. Here, "positive-polarity" and "negative-polarity" is indicative of the coupling between the windings: a positively increasing instantaneous current entering the positive-polarity terminal of the first winding 202A induces a positive polarity voltage on the positive-polarity terminal of the second winding 202B (relative to the negative-polarity terminal of the second winding 202B).

In embodiments, the number of turns in the first winding 202A is the same as a number of turns in the second winding 202B.

In embodiments, an area occupied by the first winding 202A physically overlaps an area occupied by the second winding 202B.

The capacitor bank 206 comprises a first capacitor 206A couple between the first terminal of the capacitor bank 206 and a bias voltage terminal $V_{bias}$ and a second capacitor 206B couple between the second terminal of the capacitor bank 206 and the bias voltage terminal $V_{bias}$. The bias voltage terminal $V_{bias}$ is coupled to a fixed (DC) voltage, and therefore may be equivalent to a ground node to an AC signal; in embodiments, the bias voltage terminal $V_{bias}$ may be coupled to ground (that is, 0V).

In embodiments, the first capacitor 206A may be identical to the second capacitor 206B. Accordingly, in embodiments wherein the first capacitor 206A and the second capacitor 206B have fixed capacitances, a capacitance of the first capacitor 206A may be substantially equal to a capacitance of the second capacitor 206B, and in other embodiments wherein the first capacitor 206A and the second capacitor 206B are variable capacitors controlled by the capacitance control signal CCTL, the capacitance of the first capacitor 206A for a given value of the capacitance control signal CCTL may be substantially equal to the capacitance of the second capacitor 206B for that value of the capacitance control signal CCTL.

Figure 3A:
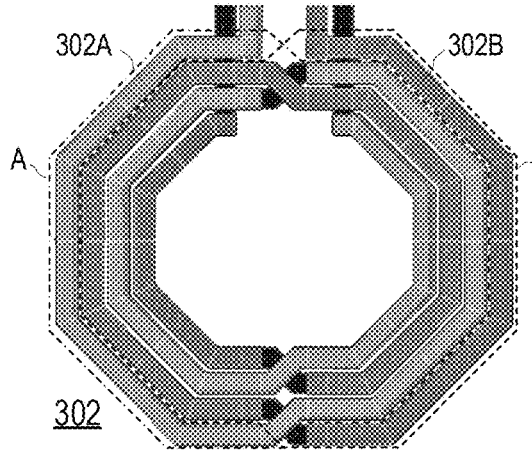
FIG. 3A illustrates a filter transformer for a notch filer according to an embodiment.

FIG. 3A illustrates a filter transformer 302 for a notch filer according to an embodiment, and in particular a layout of the filter transformer 302 on a semiconductor device (such a semiconductor die or substrate). The filter transformer 302 may correspond to the filter transformer 202 of FIG. 2.

The filter transformer 302 includes a first winding 302A and a second winding 302B. Light gray portions of each winding indicate portions of the winding on a first layer of the semiconductor device, darker gray areas of each winding indicate portions of the winding on one or more second layers of the semiconductor device that are used to connect the portions on the first layer. The one or more second layers may each be above or below the first layer.

As shown in FIG. 3A, the first winding 302A occupies a first area A, the second winding 302B occupies a second area B, and the first area A overlaps the second area B. In embodiments, the first area A may be the smallest continuous area that encloses all of the first winding 302A, and the second area B may be the smallest continuous area that encloses all of the second winding 302B. In embodiments, the overlap area includes two-thirds or more of the first area A and two-thirds or more of the second area B.

Figure 3B:
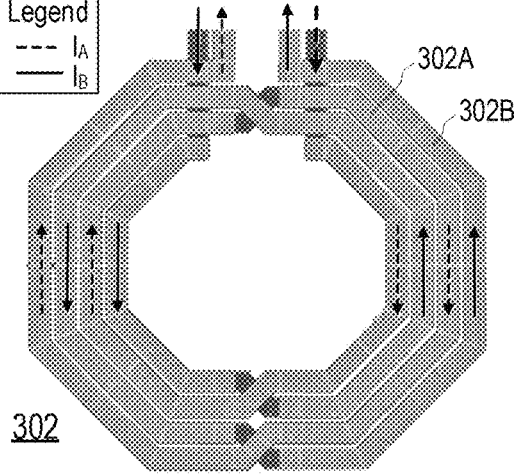
FIG. 3B illustrates current flows in the filter transformer of FIG. 3A.

FIG. 3B illustrates relative current flows in the filter transformer 302 of FIG. 3A, and in particular current flows for a differential component of signal provided to the notch filter 200 of FIG. 2 incorporating the filter transformer 302 as the filter transformer 202.

In particular, FIG. 3B shows that when a first current $I_A$ corresponding to the differential component is flowing in one direction (for example, clockwise) in the first winding 302A, a second current $I_B$ corresponding to the differential component flows in the opposite direction (for example, counter-clockwise) is the second winding 302B. Accordingly, the magnetic fields respectively generated by the first and second windings 302A and 302B oppose each other, and therefore the inductance of the filter transformer 302 is substantially zero with regard to the differential component.

In contrast, for a common mode component (not shown) of a signal provided to the notch filter 200 of FIG. 2 incorporating the filter transformer 302 as the filter transformer 202, the first and second currents $I_A$ and $I_B$ flow in the same direction, the magnetic fields respectively generated by the first and second windings 302A and 302B reinforce each other. and therefore the inductance of the filter transformer 302 is not zero with regard to the common mode component, as further explained below.

Figure 4A:
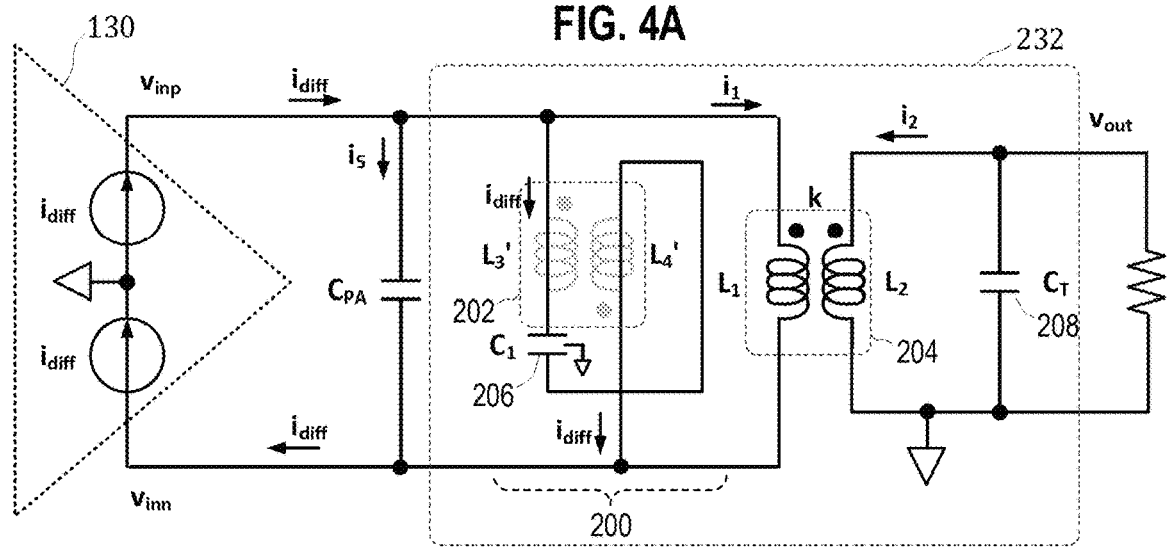
FIG. 4A is an equivalent circuit showing differential-mode operation of a load circuit including a notch filter according to an embodiment.

FIG. 4A is an equivalent circuit showing differential-mode operation of the load circuit 232 including a notch filter 200 according to an embodiment.

For the differential mode signal, the magnetic field on the filter transformer 202 is canceled out because the first and second windings of the filter transformer 202 generate respective magnetic fields in opposite directions due to the coupling direction of the filter transformer 202. As a result, the filter transformer 202 is not inductive anymore and the notch filter 200 is equivalent, for the differential mode signal, not to an LC resonator circuit but to the capacitor bank 206. If we choose the capacitance value of $C_1$ of the capacitor bank 206 and of other capacitors properly, the power amplifier (PA) 130 load is equivalent to the LC tuned load consisting of the capacitors including the capacitor bank 206 and the inductance of the balun transformer 204. As a result, the notch filter 200 does not suppress the differential mode signal, and the differential mode signal (that is, the fundamental wanted signal) does not experience any signal loss due to the notch filter 200.

Figure 4B:
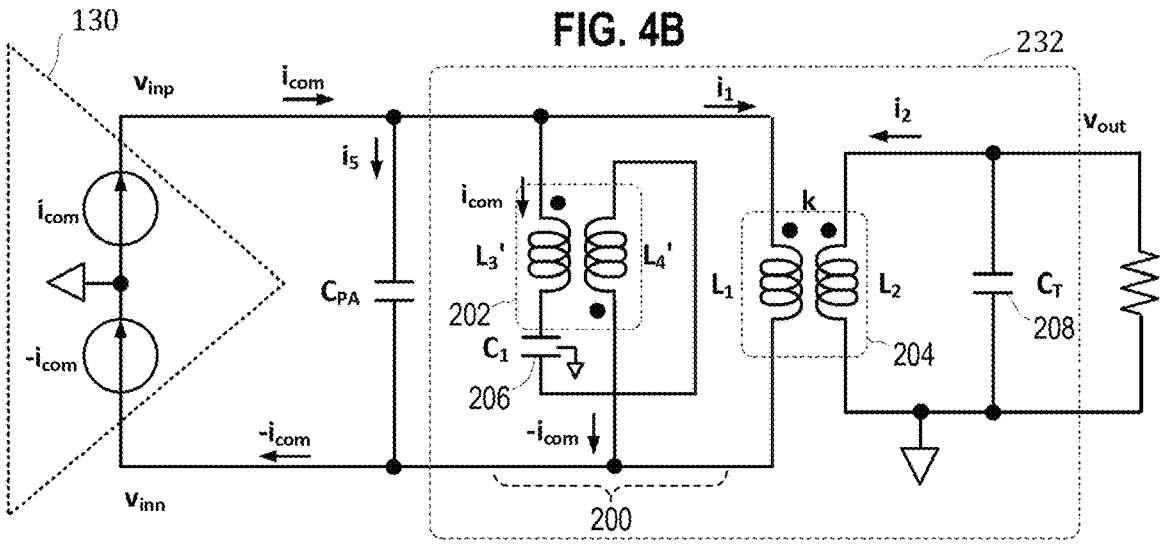
FIG. 4B is an equivalent circuit showing common-mode operation of a load circuit including a notch filter according to an embodiment.

FIG. 4B is an equivalent circuit showing common-mode operation of a load circuit 232 including a notch filter 200 according a to an embodiment.

For the common mode signal (and in particular, for the even order harmonics including the second order harmonic of the desired signals), the first and second windings of the filter transformer 202 generate respective the magnetic fields in the same direction and the total inductance on the first and second windings is increased due to constructive coupling of the magnetic fields. As a result, the physical size of the filter transformer 202 (and, as a result, the notch filter 200) may be substantially smaller than filter transformers (and notch filters) of the related arts, because not only the self-inductance of the windings but also mutual-inductance between the windings contribute to the total inductance of the LC resonator circuit.

More detailed design equations follow.

The impedance matrix of a transformer may be represented as:

$$\begin{bmatrix} v_1 \\ v_2 \end{bmatrix} = \begin{bmatrix} sL_{11} & sM_{12} \\ sM_{21} & sL_{22} \end{bmatrix} \cdot \begin{bmatrix} i_1 \\ i_2 \end{bmatrix} \qquad \text{Equation 1}$$

wherein $v_1$ is a voltage across the first winding, $v_2$ is a voltage across a second winding, $i_1$ is a current through the first winding, $i_2$ is a current through the second winding, $L_{11}$ is a self-inductance of the first winding, $L_{22}$ is a self-inductance of the second winding, $M_{12}$ is a mutual inductance between the first and second windings, $M_{21}$ is a mutual inductance between the second and first windings, and s is a complex number frequency parameter equal to $2 \times \pi \times f$, where f is the frequency.

Accordingly, the impedance ($z_{XC}$) on each of the power amplifier output nodes coupled to the notch filter 200 is:

$$z_{XC} = \frac{v_{L3} + v_{C1L3}}{i_3} = \frac{v_{L4} + v_{C1L4}}{-i_4} \qquad \text{Equation 2}$$

where $v_{L3}$ is a voltage drop across the first winding (202A in FIG. 2) of the filter transformer 202, $v_{L4}$ is a voltage drop across the second winding (202B in FIG. 2) of the filter transformer 202, $i_3$ is a current through the first winding, $i_4$ is a current through the second winding, $v_{C1L3}$ is a voltage drop across the first capacitor (206A in FIG. 2) of the capacitor bank 206, and $v_{C1L4}$ is a voltage drop across the second capacitor (206B in FIG. 2) of the capacitor bank 206.

The values can be expressed as follows by using the general impedance matrix of the filter transformer 202:

$$v_{L3} = sL_{33} \cdot i_3 - sM_{34} \cdot i_4 \qquad \text{Equation 3}$$

$$v_{L4} = sL_{43} \cdot i_3 - sL_{44} \cdot i_4 \qquad \text{Equation 4}$$

$$v_{C1L3} = \frac{1}{2sC} \cdot i_3 \qquad \text{Equation 5}$$

$$v_{C1L4} = \frac{1}{2sC} \cdot i_4 \qquad \text{Equation 6}$$

where $L_{33}$ is a self-inductance of the first winding (202A in FIG. 2) of the filter transformer 202, $L_{44}$ is a self-inductance of the second winding (202B in FIG. 2) of the filter transformer 202, $M_{34}$ is a mutual-inductance of the first winding to the second winding, $M_{43}$ is a mutual-inductance of the second winding to the first winding, and C is the capacitance of the capacitor bank 206.

If we assume $L_{33} \approx M_{34}$ and $L_{44} \approx M_{43}$, equations 3 through 6 are summarized as followings for the differential mode, wherein $i_3 = i_4 = i_{diff}$, as follows:

$$v_{L3} = s(L_{33} - M_{34}) \cdot i_{diff} \approx 0 \quad \text{Equation 7}$$

$$v_{L4} = s(M_{43} - L_{34}) \cdot i_{diff} \approx 0 \quad \text{Equation 8}$$

$$v_{C1L3} = \frac{1}{2sC} \cdot i_{diff} \quad \text{Equation 9}$$

$$v_{C1L4} = -\frac{1}{2sC} \cdot i_{diff} \quad \text{Equation 10}$$

If we define the voltage drop through the entire capacitor bank 206 as $v_{C1}$, $$v_{C1} = v_{C1L3} - v_{C1L4} = \frac{1}{sC} \cdot i_{diff} \quad \text{Equation 11}$$

As described before, the voltage drop through the transformer becomes zero, and the second order harmonic trap circuit is equivalent to the capacitor bank 206.

In a real case, the self-inductances ($L_{33}$ and $L_{44}$) are not exactly the same as the mutual-inductances ($M_{34}$ and $M_{43}$), and the filter transformer 202 shows a small residual inductance of ($L_{33} - M_{34}$) and ($M_{43} - L_{44}$). However, this residual inductance is very small. As a result, the resonance frequency resulting from these residual inductances and the capacitor bank is very high and placed far away from the fundamental frequency, and accordingly this residual inductance is negligible.

Equations 3 through 6 are summarized as follows for the common mode, wherein $i_3 = i_4 = i_{com}$:

$$v_{L3} = s(L_{33} + M_{34}) \cdot i_{com} \quad \text{Equation 12}$$

$$v_{L4} = s(M_{43} + sL_{44}) \cdot i_{com} \quad \text{Equation 13}$$

$$v_{C1L3} = \frac{1}{2sC} \cdot i_{com} \quad \text{Equation 14}$$

$$v_{C1L4} = -\frac{1}{2sC} \cdot i_{com} \quad \text{Equation 15}$$

When the impedance transform ratio of the filter transformer 202 is 1:1, then $L_{33} = L_{44}$ and $M_{34} = M_{43}$, and as a result:

$$v_{L4} = s(M_{34} + sL_{33}) \cdot i_{com} \quad \text{Equation 13B}$$

Because the center of the capacitor bank 206 is AC-grounded, the impedance of the second order harmonic trap circuit becomes zero with the following relations:

$$\therefore z_{XC} = s(L_{33} + M_{34}) + \frac{1}{2sC} \quad \text{Equation 16}$$

$$2 \cdot f_c = \frac{1}{\sqrt{(L_{33} + M_{34}) \cdot 2 \cdot C}} \quad \text{Equation 17}$$

where $f_c$ is the center frequency of the notch filter, and C is the capacitance of the capacitor bank 206. The resonance condition is very similar to the resonance condition $2 \cdot f_c = 1/\sqrt{(L \cdot 2 \cdot C)}$ of a conventional LC notch circuit, but the resonance equation of the notch filter according to an embodiment includes not only the self-inductance (L33) but also the mutual-inductance (M34) of the inductors. As a result:

1) The filter transformer 202 according to an embodiment may be made by overlapping the two windings thereof. This results in a large reduction in area as the filter transformer 202 is much smaller than two inductors having equivalent inductance in a filter of the related arts.
2) For the filter transformer as utilized in embodiments, not only the self-inductance but also the mutual-inductance contribute to the resonance frequency. As a result, the filter transformer 202 according to an embodiment can shrink even more compared to even one of two inductors of the filter of the related arts.
3) The coupling effect is fully accounted for in the second order harmonic notch filter design. As a result, there is no need to separate the inductors to minimize the coupling, and no need to conduct extensive EM (Electro-Magnetic) simulation of the notch filter during the design process.

Figure 5:
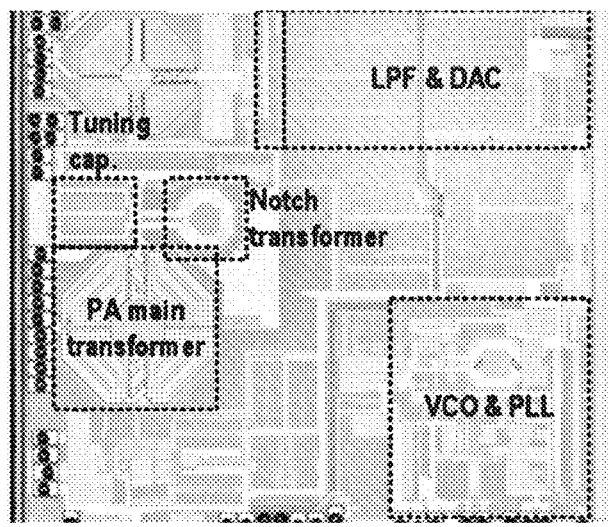
FIG. 5 shows a layout of a notch filter in a semiconductor device according to an embodiment.

FIG. 5 shows a layout of a notch filter in a semiconductor device according to an embodiment. In FIG. 5, the feature labeled "notch transformer" corresponds to the filter transformer (such as the filter transformer 202 of FIG. 2) of a notch filter according to an embodiment, and the feature labeled "tuning cap" corresponds to a capacitor bank (such as the capacitor bank 206 of FIG. 2) of the notch filter according to the embodiment. The feature labeled "PA main transformer" corresponds to the balun transformer 204.

As can be seen in FIG. 5, the notch filter comprised of the "tuning cap" and the "notch transformer" is relatively small and compact compared to the other components integrated on the semiconductor device.

Figure 6:
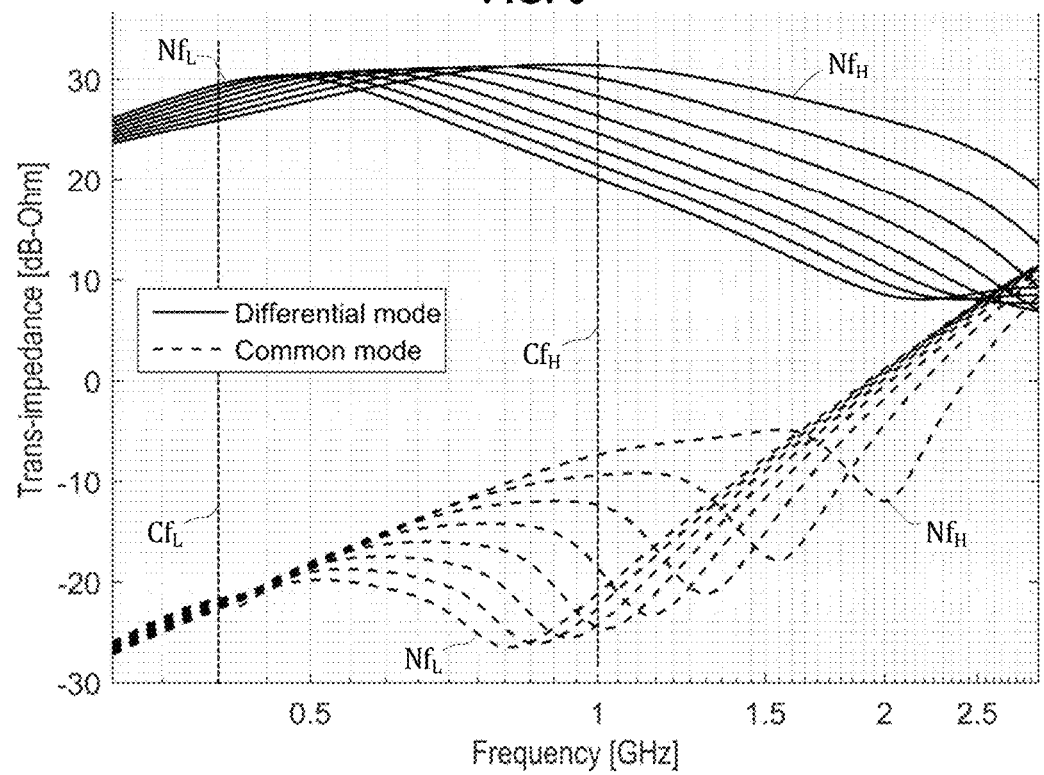
FIG. 6 illustrates performance of a notch filter according to an embodiment for common-mode and differential-mode signals.

FIG. 6 illustrates simulated performance of a notch filter according to an embodiment for common-mode and differential-mode signals. FIG. 6 shows the response of a notch filter according to embodiment when tuned to a variety of frequencies ranging from a lowest notch frequency NE of approximately 800 MHz (corresponding to a second harmonic of a lowest carrier frequency CE of approximately 400 MHz) to a highest notch frequency $Nf_H$ of approximately 2000 MHz (corresponding to a second harmonic of a highest carrier frequency $Cf_H$ of approximately 1000 MHz).

As can be seen in FIG. 6, the notch filter according to an embodiment present common mode signals at the notch frequency (such as currents at a second harmonic of the carrier frequency such as may be generated in a class-AB power amplifier) with a substantially lowered impedance than differential mode signals (such as the desired output of the power amplifier).

As a result, in a transmitter circuit according to an embodiment (such as shown in part in FIG. 2), the currents of the second-harmonic common mode signals are almost entirely diverted through the notch filter instead of through the balun transformer, and therefore are not output by the transmitter circuit. In contrast, the differential mode signals that are the wanted signals are substantially unaffected by the notch filter.

Figure 7:
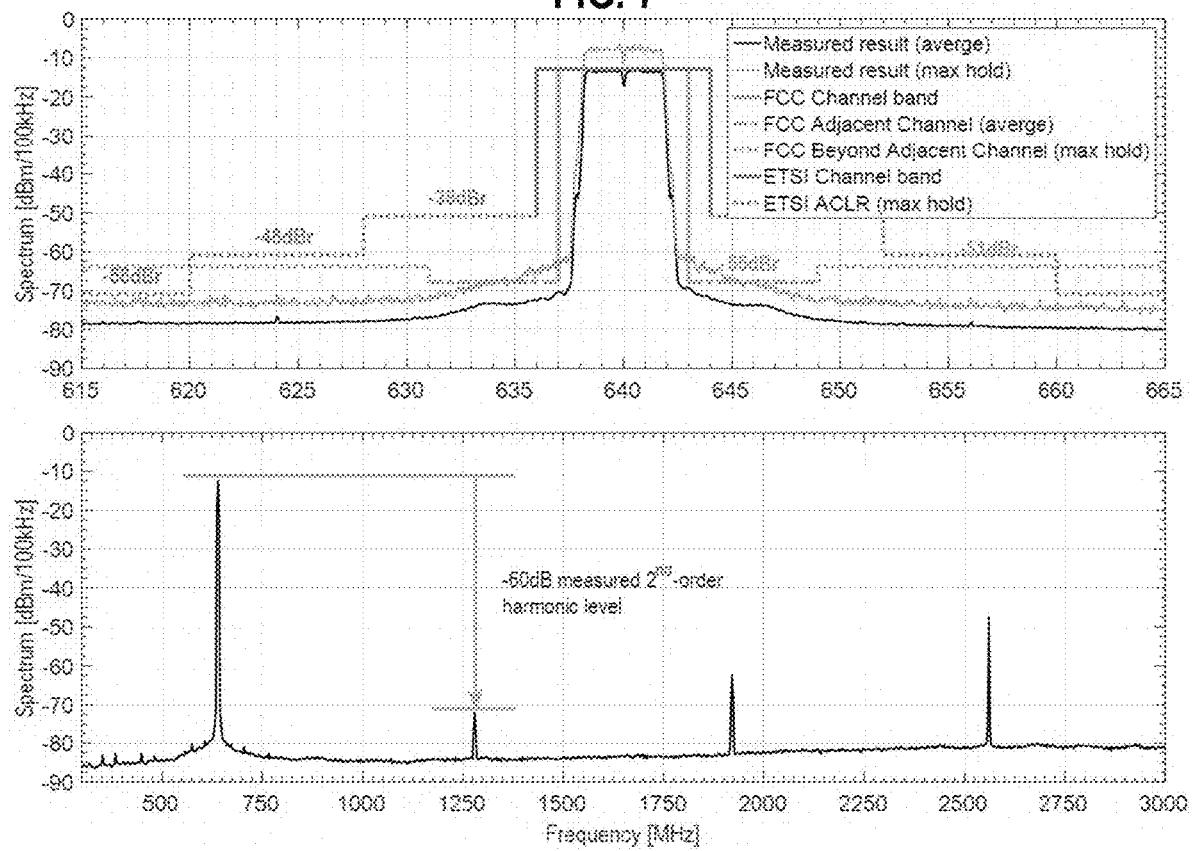
FIG. 7 illustrates performance of a notch filter according to an embodiment versus emission requirements of various standards.

FIG. 7 illustrates performance of a notch filter according to an embodiment versus emission requirements imposed by various regulatory agencies. The example shown is for a carrier frequency of 640 MHz, wherein the notch filter is configured to have a 1280 MHz notch frequency.

As shown in the embodiment, a transmitter circuit using a notch filter according to an embodiment outputs second order harmonics at 60 decibels (dB) below the wanted signal, and produces out-of-band transmissions well below those allowed by the US Federal Communications Frequency (FCC) and the European Telecommunications Standards Institute (ETSI) standards.

Figure 8:
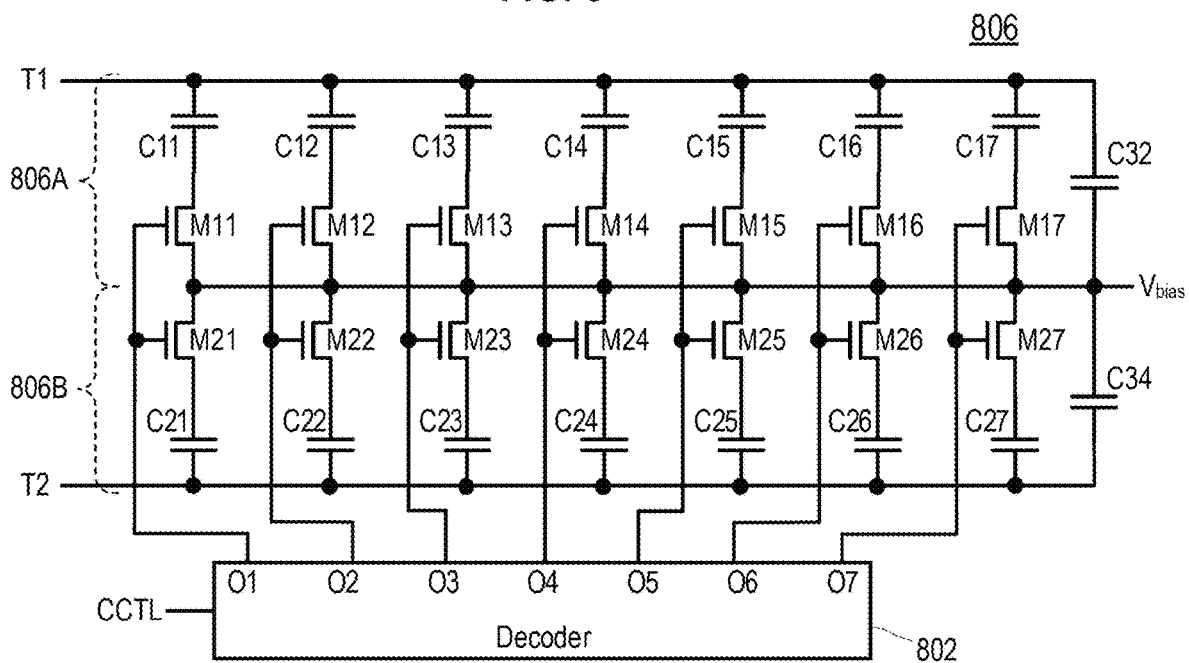
FIG. 8 illustrates a variable capacitor bank according to an embodiment.

FIG. 8 illustrates a variable capacitor bank 806 according to an embodiment. The variable capacitor bank 806 may be included in the capacitor bank 206 of FIG. 2, and includes a first variable capacitor 806A which may correspond to the first capacitor 206A of capacitor bank 206 and a second variable capacitor 806B which may correspond to the first capacitor 206B of capacitor bank 206. The embodiment shown in FIG. 8 is purely illustrative, and should not be viewed as limiting the scope of the invention.

A first terminal T1 of the variable capacitor bank 806 is coupled to respective first terminals of a first plurality of switched capacitors and a first terminal of a first fixed capacitor C32; the first plurality of switched capacitors includes first through seventh switched capacitors C11, C12, C13, C14, C15, C16, and C17 having second terminals respectively coupled to first conduction terminals of first through seventh switches M11, M12, M13, M14, M15, M16, and M17. Second conduction terminals of the first through seventh switches M11, M12, M13, M14, M15, M16, and M17 are respectively coupled to a bias voltage $V_{bias}$; in an embodiment, the bias voltage $V_{bias}$ may be ground. A second terminal of a first fixed capacitor C32 is also coupled to the bias voltage $V_{bias}$.

A second terminal T2 of the variable capacitor bank 806 is coupled to respective first terminals of a second plurality of switched capacitors and a first terminal of a second fixed capacitor C34; the second plurality of switched capacitors includes eighth through fourteenth switched capacitors C21, C22, C23, C24, C25, C26, and C27 having second terminals respectively coupled to first conduction terminals of eighth through fourteenth switches M21, M22, M23, M24, M25, M26, and M27. Second conduction terminals of the eighth through fourteenth switches M21, M22, M23, M24, M25, M26, and M27 are respectively coupled to a bias voltage $V_{bias}$; in an embodiment, the bias voltage $V_{bias}$ may be ground. A second terminal of a second fixed capacitor C34 is also coupled to the bias voltage $V_{bias}$.

A decoder circuit 802 receives a capacitance control signal CCTL and decodes it to produce first to seventh control outputs O1, O2, O3, O4, O5, O6, and O7. In an embodiment, the capacitance control signal CCTL is a 3-bit digital signal and the decoder circuit 802 turns on a number of the first to seventh control outputs O1, O2, O3, O4, O5, O6, and O7 equal to a binary value expressed on the 3 bits of the capacitance control signal CCTL. However, embodiments are not limited thereto.

The first to seventh control outputs O1, O2, O3, O4, O5, O6, and O7 are respectively coupled to control terminals of first through seventh switches M11, M12, M13, M14, M15, M16 and respectively coupled to control terminals of eighth through fourteenth switched capacitors C21, C22, C23, C24, C25, C26, and C27.

A capacitance of the first variable capacitor 806A is therefore equal to the sum of the capacitances of the first through seventh switched capacitors C11, C12, C13, C14, C15, C16, and C17 that have respective switches turned on and the capacitance of the first fixed capacitor C32. A capacitance of the second variable capacitor 806B is therefore equal to the sum of the capacitances of the eighth through fourteenth switched capacitors C21, C22, C23, C24, C25, C26, and C27 that have respective switches turned on and the capacitance of the second fixed capacitor C34.

In an embodiment wherein the capacitances of the first through seventh switched capacitors C11, C12, C13, C14, C15, C16, and C17 are respectively equal to the capacitances of the eighth through fourteenth switched capacitors C21, C22, C23, C24, C25, C26, and C27 and the capacitance of the first fixed capacitor C32 is equal to the capacitance of the second fixed capacitor C34, the capacitance of the first variable capacitor 806A will be equal to the capacitance of the second variable capacitor 806B for all values of the capacitance control signal CCTL.

The circuits according to embodiments provide a compact notch filter for attenuating common-mode currents at and around even harmonics of a carrier frequency without significant attenuation of differential-mode currents corresponding to a wanted signal at and around the carrier frequency. By exploiting rather than avoiding mutual coupling between inductors in the notch filter, embodiments reduce design complexity by reducing the need for complex electromagnetic simulation of the design. Embodiments may be implemented on a semiconductor die or semiconductor substrate.

Embodiments of the present disclosure include electronic devices, e.g., one or more packaged semiconductor devices, configured to perform one or more of the operations described herein. Embodiments of the present disclosure may be implemented in a single semiconductor die. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined. The order of operations described in embodiments is illustrative and may be re-ordered unless otherwise constrained. Further, features of two or more embodiments may be combined to form a new embodiment.

What is claimed is:

1. A circuit comprising:
  a first input node;
  a second input node;
  a bias voltage node coupled to a direct-current (DC) voltage value; and
  a notch filter, the notch filter comprising:
    a filter transformer including a first winding and a second winding, and
    a capacitor bank including a first capacitor and a second capacitor,
  wherein a positive-polarity terminal of the first winding is coupled to the first input node and a negative-polarity terminal of the first winding is coupled to a first terminal of the first capacitor;
  wherein a positive-polarity terminal of the second winding is coupled to the second input node and a negative-polarity terminal of the second winding is coupled to a first terminal of the second capacitor, and
  wherein a second terminal of the first capacitor and a second terminal of the second capacitor are coupled to the bias voltage node.

2. The circuit of claim 1, wherein a ratio of a number of turns of the first winding to a number of turns of the second winding is 1-to-1.

3. The circuit of claim 1, wherein a self-inductance of the first winding is substantially equal to a self-inductance of the second winding.

4. The circuit of claim 1, wherein a self-inductance of the first winding is substantially equal to a mutual-inductance between the first winding and the second winding.

5. The circuit of claim 1,
wherein the first winding and the second winding are disposed within a semiconductor die, and
wherein an area occupied by the first winding overlaps an area occupied by the second winding.

6. The circuit of claim 5, wherein the capacitor bank is disposed within the semiconductor die.

7. The circuit of claim 1, wherein the bias voltage node is coupled to ground.

8. The circuit of claim 1, wherein a capacitance of the first capacitor is equal to a capacitance of the second capacitor.

9. The circuit of claim 1,
wherein the first capacitor is a variable capacitor having a capacitance controlled by a capacitance control signal, and
wherein the second capacitor is a variable capacitor having a capacitance controlled by the capacitance control signal.

10. The circuit of claim 9, wherein for each of a plurality of values of the capacitance control signal, a capacitance of the first capacitor corresponding to that value is equal to a capacitance of the second capacitor corresponding to that value.

11. The circuit of claim 1, further comprising:
an output transformer including a primary winding and secondary winding,
wherein a first terminal of the primary winding is coupled to the first input node and a second terminal of the primary winding is coupled to the second input node.

12. The circuit of claim 11,
wherein the first input node is coupled to a positive output signal of a differential power amplifier, and
wherein the second input node is coupled to a negative output signal of the differential power amplifier.

* * * * *